United States Patent
Gillies et al.

(10) Patent No.: US 8,618,528 B2
(45) Date of Patent: Dec. 31, 2013

(54) QUANTUM DOT PARTICLES ON THE MICRON OR NANOMETER SCALE AND METHOD OF MAKING THE SAME

(75) Inventors: Jennifer Gillies, Petersburg, NY (US); David Socha, Delmar, NY (US); Michael Locascio, Clifton Park, NY (US)

(73) Assignee: Samsung Electronics Co., Ltd. (KR)

( * ) Notice: Subject to any disclaimer, the term of this patent is extended or adjusted under 35 U.S.C. 154(b) by 61 days.

(21) Appl. No.: 13/017,433

(22) Filed: Jan. 31, 2011

(65) Prior Publication Data
US 2012/0193605 A1    Aug. 2, 2012

Related U.S. Application Data

(63) Continuation of application No. 12/052,380, filed on Mar. 20, 2008, now abandoned.

(60) Provisional application No. 60/918,927, filed on Mar. 20, 2007.

(51) Int. Cl.
*H01L 33/06* (2010.01)

(52) U.S. Cl.
USPC .............................................. 257/13; 252/512

(58) Field of Classification Search
USPC .............. 257/13; 252/512, 513, 514, 518.1, 252/519.4; 427/213.3, 403; 977/723, 779, 977/785
See application file for complete search history.

(56) References Cited

U.S. PATENT DOCUMENTS

| | | | |
|---|---|---|---|
| 6,207,392 B1 | 3/2001 | Weiss et al. | |
| 6,656,568 B1 | 12/2003 | Winningham et al. | |
| 6,918,946 B2 | 7/2005 | Korgel et al. | |
| 7,173,367 B2 | 2/2007 | Sanghera et al. | |
| 2003/0148544 A1 * | 8/2003 | Nie et al. | 436/524 |
| 2007/0045777 A1 | 3/2007 | Gillies et al. | |

OTHER PUBLICATIONS

Chang et al., "Preparation and Properties of Tailored Morphology, Monodisperse Colloidal Silica-Cadmium Sulfide Nanocomposites", J. Am. Chem. Soc., 1994, 116, pp. 6739-6744.*
Chang et al., "Preparation and Properties of Tailored Morphology, Monodisperse Colloidal Silica-Cadmium Sulfide Nanocomposites", J. Am. Chem. Soc. 1994, vol. 116, No. 14, pp. 6739-6744.
Soo, Intl. App. No. PCT / US2008 / 057681, "PCT Search Report and Written Opinion", Jul. 31, 2008, 8 pages.
Kopec, U.S. Appl. No. 12/052,380, Office Action Communication, 11739-141, Aug. 4, 2010, 9 pages.

* cited by examiner

*Primary Examiner* — Thomas L Dickey
(74) *Attorney, Agent, or Firm* — Cantor Colburn LLP

(57) ABSTRACT

Powdered quantum dots that can be dispersed into a silicone layer are provided. The powdered quantum dots are a plurality of quantum dot particles, preferably on the micron or nanometer scale. The powdered quantum dots can include quantum dot-dielectric particle complexes or quantum dot-crosslinked silane complexes. The powdered quantum dots can included quantum dot particles coated with a dielectric layer.

9 Claims, 5 Drawing Sheets

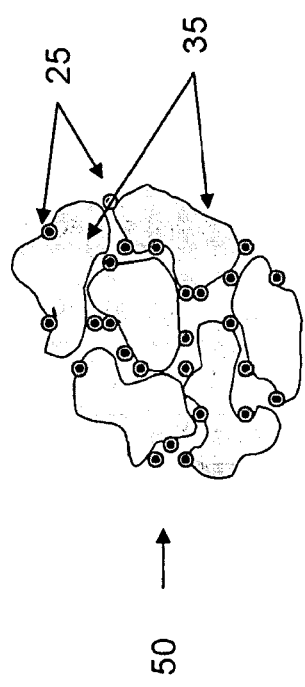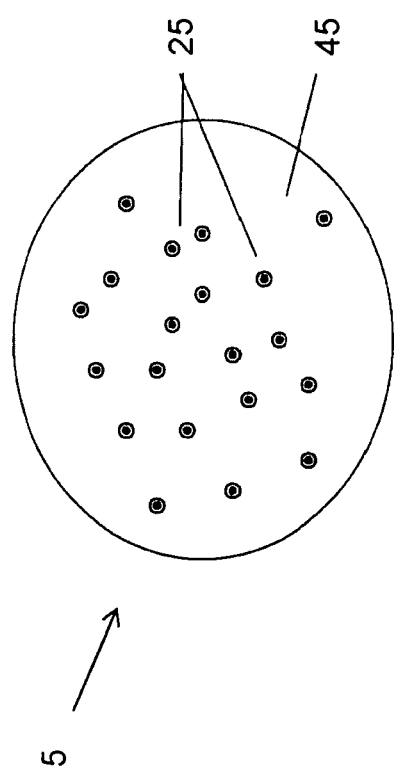

QUANTUM DOT PARTICLES ON THE MICRON OR NANOMETER SCALE AND METHOD OF MAKING THE SAME

CROSS-REFERENCE TO RELATED APPLICATION

This application is a continuation of U.S. patent application No. 12/052,380, filed on Mar. 20, 2008, which claims priority to U.S. Provisional Application No. 60/918,927, filed on Mar. 20, 2007, which are incorporated by reference herein.

TECHNICAL FIELD

The present invention relates to powdered quantum dots and methods of making and using the same.

BACKGROUND

Quantum dots (QDs) comprise colloidal semiconductor cores that are small, often spherical, crystalline particles composed of group II-VI, III-V, IV-VI, or I-III-VI semiconductor materials. Each semiconductor core is a nanocrystal consisting of hundreds to thousands of atoms. Quantum dots are neither atomic nor bulk semiconductors, but may best be described as artificial atoms. Their properties originate from their physical size, which ranges from about 1 to about 10 nanometers (nm) in radius, and are often comparable to or smaller than the bulk Bohr exciton radius. As a consequence, quantum dots no longer exhibit the optical or electronic properties of their bulk parent semiconductor. Instead, they exhibit novel electronic properties due to what are commonly referred to as quantum confinement effects. These effects originate from the spatial confinement of intrinsic carriers (electrons and holes) to the physical dimensions of the material rather than to bulk length scales. One of the better-known confinement effects is the increase in semiconductor band gap energy with decreasing particle size; this manifests itself as a size dependent blue shift of the band edge absorption and luminescence emission with decreasing particle size.

As the nanocrystals increase in size past the exciton Bohr radius, they become electronically and optically bulk-like. Therefore they cannot be made to have a smaller band gap than exhibited by the bulk materials of the same composition, implying that the longest wavelength that can be emitted by a quantum dot is equivalent to the bulk band gap energy. Thus, quantum dots comprise materials with band gaps less than 0.413 eV and 0.248 eV for 3 micron and 5 micron emission respectively.

The band gap and the resulting absorption onset and emission wavelength are determined by the nanocrystal size. Each individual nanocrystal emits light with a line width comparable to that of atomic transitions. Any macroscopic collection of nanocrystals, however, emits a line that is inhomogeneously broadened due to the fact that every collection of nanocrystals is unavoidably characterized by a distribution of sizes. Presently the highest quality samples can be produced with size distributions exhibiting roughly a minimum of 5% variation in nanocrystal volume. This directly dictates the width of the inhomogeneously-broadened line which corresponds to ~35 nm for CdSe, ~70 nm for InGaP, and ~100 nm for PbS. These same material systems can be tuned to have a peak emission wavelength from 490 nm "blue" through the visible and the short wavelength infrared to 2300 nm.

The absorption spectra are dominated by a series of overlapping peaks with increasing absorption at shorter wavelengths. Each peak corresponds to an excitonic energy level, where the first exciton peak (i.e. the lowest energy state) is synonymous with the blue shifted band edge. Short wavelength light that is absorbed by the quantum dot will be down converted and reemitted at a shorter wavelength. The efficiency at which this down conversion process occurs is denoted by the quantum yield. Non-radiative exciton recombination reduces quantum yield due to the presence of interband states resulting from dangling bonds at the quantum dot surface and intrinsic defects. Quantum yields can be greatly increased to nearly 90% in some circumstances by passivating the surface of the quantum dot core through the addition of a wide band gap semiconductor shell to the outside of the nanocrystal.

The nanocrystals or semiconductor cores are typically coated with one or more inorganic semiconductor shells, each of which is typically 0.1-10 monolayers thick, or about 1 angstrom to 2 nm thick. Common shell compositions include, but are not limited to, wide band gap semiconductors such as zinc sulfide and cadmium sulfide. The shells serve to increase the quantum yield (brightness) of the photoluminescent emission by occupying surface dangling bonds and defects that tend to cause non-radiative interband states.

Quantum dots are usually enveloped by a layer of surfactant molecules having one or more functional groups that bind to the metal atoms on the quantum dots surface (examples of the functional groups include, but are not limited to, phosphine, phosphine oxide, thiol, amine carboxylic acid, etc.) and one or more moieties on the opposite end from the metal-binding groups to increase the solubility of the quantum dot in a given solvent or matrix material. For example, hydrophobic aliphatic, alkane, alicyclic, and aromatic groups on the distal ends of the surfactant molecules increase the solubility of the quantum dots in hydrophobic solvents, while polar or ionizable groups increase the solubility of the quantum dots in hydrophilic and aqueous solvents.

Quantum dots are sensitive to the chemistry of the environment in which they reside. Defects such as dislocations, atomic vacancies, or oxide bonds can be introduced onto quantum dot surfaces in acidic or oxidative conditions or in the presence of radicals, certain catalysts, and other reactive compounds. Defect formation is exacerbated when the quantum dots are illuminated. The prevalence of defect is related to the density of interband states and hence the probability of non-radiative recombination events. The overall result is that in certain chemically reactive and photoxidative environments the quantum yields of the quantum dots are greatly and irreversibly diminished. However, many applications of quantum dots require that they reside in these environments.

Furthermore, sulfur atoms, which are one component of zinc sulfide shells that are frequently used to passivate nanocrystal cores, as well as amine moieties, which is often a component of the surfactant layer that envelopes the nanocrystal cores, may adversely affect the matrix material in which the quantum dots are dispersed. For example, both sulfur and amines effectively reduce the activity of platinum-based catalysts that are frequently used to crosslink two-part silicones. These silicones are frequently used as encapsulant materials for LEDs, solar cells, and other optoelectronic devices.

To date, microparticles containing quantum dots have been developed by dispersing quantum dots in a liquid phase polymeric matrix materials (examples include various plastics, silicones, and epoxies), curing or drying the composite into a solid form, and then milling the composite into micron scale particles. However, these particles suffer drawbacks. Organic matrix materials degrade under intense illumination and under high energy (i.e. short wavelengths such as ultraviolet)

light. Further, many organic materials have relatively low melting points or may degrade at elevated temperatures. Many organic polymers, particularly silicones, are also very permeable to oxygen, which may attack the quantum dots dispersed therein.

Methods of dispersing or coating quantum dots in an inorganic matrix such as silica have been shown in the art. For example, others have used tetraethylorthosilicate (TEOS) to glass-coat nanocrystals. However this and similar approaches greatly diminish the nanocrystals' quantum yield.

SUMMARY

The present invention provides quantum dot particles, powdered quantum dots, quantum dot composites, devices comprising the same, and methods of making the same.

In an embodiment, the present invention provides a quantum dot particle on the micron or nanometer scale comprising a plurality of quantum dots and a plurality of dielectric particles on the micron or nanometer scale. The plurality of quantum dots are absorbed onto the surfaces of the plurality of dielectric particles to form a plurality of quantum dot-dielectric particle complexes. The quantum dot-dielectric particle complexes form aggregates, which are quantum dot particles on the micron or nanometer scale or can be further broken down to quantum dot particles on the micron or nanometer scale. The present invention also provides a plurality of quantum dot particles (referred to herein as "powdered quantum dots").

In another embodiment, the present invention provides a method of manufacturing such plurality of quantum dot particles comprising providing a dispersion of quantum dots and dielectric nano- or micro-particles in a solvent to form aggregates of a plurality of quantum dot-dielectric particle complexes, each of the plurality of quantum dot-dielectric particle complexes comprising a plurality of quantum dots absorbed onto the surface of a dielectric particle The method further comprises separating the aggregates of the quantum dot-dielectric particle complexes from the solvent. The method optionally comprises breaking down the quantum dot-dielectric particle complexes to quantum dot particles on the micron or nanometer scale.

In another embodiment, the present invention provides a quantum dot particle on the micron or nanometer scale comprising a plurality of quantum dots dispersed in a crosslinked silane matrix. The plurality of quantum dots and the crosslinked silane form a plurality of quantum dot-crosslinked silane complexes, which are quantum dot particles on the micron or nanometer scale or can be further broken down to quantum dot particles on the micron or nanometer scale. The present invention also provides a plurality of such quantum dot particles.

In another embodiment, the present invention provides a method of manufacturing such plurality of the quantum dot particles (i.e. powdered quantum dots) comprising (a) providing quantum dots, each quantum dot having a surfactant attached to the outer surface; (b) displacing the surfactant on the outer surfaces of the quantum dots with a silane in a solution; (c) crosslinking the silane on the quantum dots and the silane in solution to form quantum dot-crosslinked silane complexes, each quantum dot-crosslinked silane complex comprising a plurality of quantum dots dispersed in a crosslinked silane matrix. The method further comprises separating the quantum dot-crosslinked silane complexes from the solution. The method optionally comprises breaking down the quantum dot-crosslinked silane complexes to quantum dot particles on the micron or nanometer scale.

In certain embodiments, the quantum dot particle is coated with a dielectric layer to protect the quantum dots from photooxidation as well as to allow the quantum dots to be compatible with agents that are used to form silicone materials for example.

The plurality of quantum dot particles can be dispersed in a silicone layer or other material layer to form a quantum dot composite and used as a component in the same devices as traditional phosphors are used.

BRIEF DESCRIPTION OF DRAWINGS

FIG. 1 illustrates a quantum dot particle comprising a plurality of quantum dot-dielectric particle complexes.

FIG. 2 illustrates a quantum dot particle comprising a quantum dot-crosslinked silane complexes.

DETAILED DESCRIPTION

Figure 3:
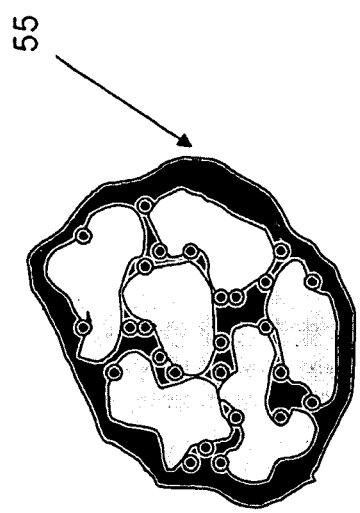
FIG. 3 illustrates a quantum dot particle coated with a dielectric layer.

The present invention provides powdered quantum dots on the micron or nanometer scale. The powdered quantum dots are capable of being used in place of convention phosphors materials in applications including, but not limited to, those requiring silicone materials including silicone elastomeric materials. For example, referring to FIG. 1, in an embodiment, the present invention provides a quantum dot particle 50 that is essentially an aggregate comprising quantum dot-dielectric particle complexes, each quantum dot-dielectric particle complex comprising individual quantum dots 25 absorbed onto the surface of individual dielectric nanoparticles or microparticles 35. The aggregate may be a quantum dot particle on the micron or nanometer scale, or it may be further broken down to a quantum dot particle on the micron or nanometer scale. In certain embodiments, each quantum dot particle 50 has a diameter between about 20 nanometers (nm) and 100 microns ($\mu$m). The present invention also provides powdered quantum dots that are a plurality of the quantum dot particles, each quantum dot particle being on the micron or nanometer scale. For most applications, these dielectric nanoparticles or microparticles are substantially transparent to both the illumination source and the light being emitted by the quantum dots. It is also preferential that the quantum dot particle be substantially impermeable to oxygen and moisture as well as to be able to resist degradation under illumination and the chemical and temperature conditions of the surrounding environment.

A quantum dot within a quantum dot particle is described in more detail below. In brief, in most embodiments, a quantum dot comprises a semiconductor core and an optional semiconductor shell. Quantum dot cores range in diameter from about 1 to 10 nanometers where the thickness of the shells is between 0.1 and 10 monolayers thick, or about 1 angstrom to 2 nm thick. Non-limiting examples of quantum dot core compositions include CdSe, CdS, CdTe, ZnS, ZnSe, PbS, PbSe, InGaP, GaP, GaN, GaSb, InSb, InP, CuInGaS, and CuInGaSe. Non-limiting shell compositions include ZnS, ZnSe, and CdS. The quantum dots are designed to absorb a portion of first wavelength derived from an illumination light source and to emit a second wavelength indicative of the size, size distribution, and composition of the quantum dot.

The dielectric particle may be any non-conducting substance on the nanometer or micron scale. Nanoscale and microscale dielectric particles (which may or may not be spherical) may have diameters between 1 nm and 10 μm. In certain preferred embodiments, they have diameters between 20 nm and 200 nm. The dielectric particles may have hydrophilic or hydrophobic surfaces onto which quantum dots can absorb. Preferably, they are substantially transparent, particularly to optical wavelengths corresponding to the spectrum of the illumination source and the emission spectrum of the quantum dots adsorbed onto their surfaces, so that they do not interfere with the photoluminescence of the quantum dots. Non-limiting examples of illumination sources include mercury vapor lamps, compact fluorescent lamps, metal halide lamps, deuterium lamps, xenon lamps, InGaN blue and UV emitting light emitting diodes (LEDs), light emitting diodes, laser diodes, glass lasers, Nd:Yag lasers, Ti:sapphire lasers, gas lasers, He:Ne lasers, rare earth doped lasers, etc. Preferably, the dielectric particles are substantially impermeable to oxygen and water vapor. Preferably, the dielectric particles have high melting temperatures, preferably greater than 100° C. Preferably, the dielectric particles are resistant to damage caused by high intensity illumination and by illumination by energetic photons (i.e. photooxidation, UV damage, etc.). The dielectric particle may be an oxide particle. Non-limiting examples of nanoscale oxide particles include fumed silica, colloidal silica, and alumina nanooxide powder.

The present invention also provides methods of making a plurality of the above-described quantum dot particles (i.e. powdered quantum dots). In certain embodiments, a method comprises providing a solution of a plurality of quantum dots in a solvent and adding dielectric nanoparticles or microparticles to the solution to form a dispersion. Alternatively, this step can comprise providing a solution of a dielectric nanoparticles or microparticles in a solvent and adding a plurality of quantum dots to the solution to form a dispersion. Still alternatively, this step can comprise providing a first solution of dielectric nanoparticles or microparticles in a solvent and providing a second solution of dielectric nanoparticles or microparticles in a solvent and combining both solutions to form a dispersion. Regardless, this step comprises providing a providing a dispersion of quantum dots and dielectric nano- or micro-particles in a solvent. When the quantum dots and dielectric nano- or micro-particles are combined they form aggregates of a plurality of quantum dot-dielectric particle complexes, each of the plurality of quantum dot-dielectric particle complexes comprising a plurality of quantum dots absorbed onto the surface of the dielectric nanoparticle or microparticles. Thus, the plurality of quantum dot-dielectric particle complexes form a plurality of aggregates. In a preferred embodiment, the quantum dots and dielectric particles are mixed to facilitate absorption of the quantum dots onto the surface of the dielectric nanoparticles or microparticles. The quantum dots and dielectric particles can be mixed by any agitation method known in the art such as, for example, sonication or other mechanical mixing mechanisms. The method further comprises separating the plurality of aggregates of quantum dot-dielectric particle complexes from the solvent. The aggregates can be separated from the solvent by solid-liquid separation techniques such as centrifugation, flocculation, sedimentation, filtration, electrophoreses, and other mechanisms. In the case of flocculation, flocculation agents can be added to the mixture including, but not limited to, multivalent cations for altering the pH, which can result in colloidal aggregation. Following separation, the residual solvent can be removed and the aggregates dried. Subsequent to separation of the aggregates from the solvent, the aggregates can optionally be broken down into quantum dot particles on the nanometer or micron scale, if not already present in the desired size range after separation. An individual aggregate (i.e. quantum dot particle) is shown in FIG. 1. Non-limiting ways of breaking up the aggregates include milling (including, but not limited to, wet milling, ball milling, and jet milling) and grinding. Preferably, the aggregates are broken into the quantum dot particles having a diameters between 20 nanometers and 100 microns.

Referring to FIG. 2, in another embodiment of the present invention, a quantum dot particle 5 on the micron or nanometer scale comprising a plurality of quantum dots 25 dispersed in a crosslinked silane matrix 45 to form a quantum dot-crosslinked silane complex 5. The complex may be a quantum dot particle on the micron or nanometer scale, or it may be further broken down to a quantum dot particle on the micron or nanometer scale. The present invention also provides powdered quantum dots that are a plurality of the quantum dot particles, each particle being on the micron or nanometer scale.

The present invention also provides methods of making a plurality of the above-described quantum dot particles (i.e. powdered quantum dots). The method generally involves using ligand exchange procedures known in the art to displace the surfactant present on the quantum dots during manufacture with a crosslinkable silane having groups capable of chelating to a metal. Generally, the ligand exchange process involves repeatedly precipitating out quantum dots in pure solvent while adding the new ligand. The result is that each quantum dot is enveloped with a monolayer of silane. Excess silane exists in solution after the ligand exchange. Subsequent to the ligand exchange process, the silane on the surface of the quantum dots and the silane in the solution are crosslinked to form quantum dot-crosslinked silane complexes, each quantum dot-crosslinked silane complex comprising a plurality of quantum dots dispersed in a crosslinked silane matrix. The quantum dot-crosslinked silane complexes can be separated from solvent via separation steps as described above. Non-limiting examples of silanes include 3-amino propyl trimethoxysilane (APS) and 3-mercapto propyl trimethoxysilane (MPS). Subsequent to separation of the quantum dot-crosslinked silane complexes from the solution, the complexes can optionally be broken down into quantum dot particles on the nanometer or micron scale, if not already present in the desired size range after separation.

In another embodiment of the present invention, a quantum dot particle according to any of the above-described embodiments is further coated with a dielectric layer. FIG. 3 illustrates a coated quantum dot particle 51 that is a quantum dot particle 50 as shown as in FIG. 1 that is coated with a dielectric layer 55. The dielectric layer comprises a second dielectric material that may be the same as or different than the material of the dielectric particles disclosed above. In a preferred embodiment, the second dielectric material is also substantially transparent to both the wavelength of the illumination source and the emission spectra of the quantum dot complexes. Optionally, the second dielectric material is substantially impermeable to oxygen and moisture and substantially resistant to degradation under high amounts of illumination and elevated temperatures. In preferred embodiments, the dielectric layer has a thickness between 1 nm and 100 μm. Non-limiting examples of the second dielectric material include silica but other dielectric materials could be used that preferably can be dispersed into and are therefore compatible with a silicone material. The present invention also provides powdered coated quantum dots, which are a plurality of quantum dot particles on the micron or nanometer scale that are coated with a dielectric layer.

Figure 4:
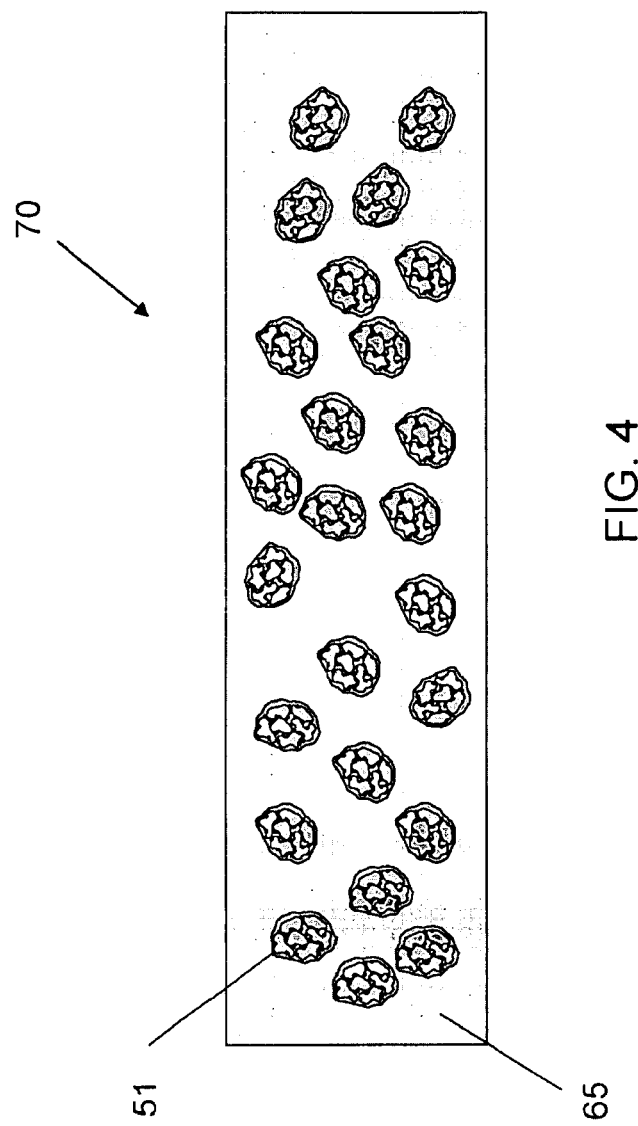
FIG. 4 illustrates a quantum dot composite comprising quantum dot particles dispersed in a silicone layer.

Referring to FIG. 4, in another embodiment, the present invention provides a composite 70 comprising powdered quantum dots 51 that are dispersed in a silicone matrix 65. It is understood that the other above-described powdered quantum dots could also be used. This composite and the quantum dot particles of the present invention in general can be used in the same variety of applications that phosphors can be used, including photoluminescent and optoelectronic devices. Photoluminescent devices can use quantum dot particles in accordance with the present invention to absorb light of a first wavelength and reemit light of a different wavelength. For example, quantum dot particles can be used in glow-in-the-dark and reflective devices such as toys, clothing, and signs, and can also be used in systems requiring encoding such as identification systems and anti-counterfeiting systems. In glow-in-the-dark and reflective devices, the light emitted by the quantum dot particles can be used for illumination. In encoding systems the quantum dot particles can be configured to reveal an indicator of identity or authenticity, such as a symbol or word, when a user of the system directs a light source at the quantum dot particles. The light source can be in either the visible or non-visible spectrum, and the emitted light can be either detectable by the human eye or detectable by an optical receiver.

Quantum dot particles of the present invention can also be used in both electrical-to-optical and optical-to-electrical optoelectronic components and devices. Optical-to-electrical components can include solar cells for producing electricity and photodiodes for turning devices on and off in either the presence or absence of light. Electrical-to-optical components can include LEDs and OLEDs that illuminate when an electric current is passed through them.

A quantum dot particle, according to the present invention, is preferably electronically and chemically stable with a high luminescent quantum yield. Chemical stability refers to the ability of a quantum dot particle to resist fluorescence quenching over time in aqueous and ambient conditions. Preferably, a quantum dot particle resist fluorescence quenching for at least a week, more preferably for at least a month, even more preferably for at least six months, and most preferably for at least a year. Electronic stability refers to whether the addition of electron or hole withdrawing ligands substantially quenches the fluorescence of the semiconductor nanocrystal composition. Preferably, a quantum dot particle is colloidally stable when suspended in organic or inorganic media matrix. Preferably, a high luminescent quantum yield refers to a quantum yield of at least 10%. Quantum yield may be measured by comparison to Rhodamine 6G dye with a 488 excitation source. Preferably, the quantum yield of the quantum dot particle is at least 25%, more preferably at least 30%, still more preferably at least 45%, and even more preferably at least 55%, and even more preferably at least 60%, including all intermediate values therebetween, as measured under ambient conditions.

All of the above-embodiments describe a quantum dot. Referring to FIG. 5A in an embodiment, the quantum dot 15 comprising a semiconductor nanocrystal core 10 (also known as a semiconductor nanoparticle or semiconductor nanocrystal) has an outer surface 21. Semiconductor nanocrystal core 10 may be spherical nanoscale crystalline materials (although oblate and oblique spheroids as well as rods and other shapes can be grown) having a diameter of less than the Bohr radius for a given material, and comprises one or more semiconductor materials. Non-limiting examples of semiconductor materials that semiconductor nanocrystal core can comprise include, but are not limited to, ZnS, ZnSe, ZnTe, CdS, CdSe, CdTe, HgS, HgSe, HgTe (group II-VI materials), PbS, PbSe, PbTe (group IV-VI materials), AlN, AlP, AlAs, AlSb, GaN, GaP, GaAs, GaSb, InN, InP, InAs, InSb (group III-V materials), $CuInGaS_2$, $CuInGASe_2$, $AgInS_2$, $AgInSe_2$, and $AuGaTe_2$ (group I-III-VI materials). In addition to binary and ternary semiconductors, semiconductor nanocrystal core 10 may comprise quaternary or quintary semiconductor materials. Non-limiting examples of quaternary or quintary semiconductor materials include $A_xB_yC_zD_wE_{2v}$, wherein each of A and B may be a group I or VII element, and each of C and D may be a group III, II, or V element (although C and D cannot both be group V element), and E may be a group VI element, wherein x, y, z, w, and v are molar ratios between 0 and 1.

Figure 5B:
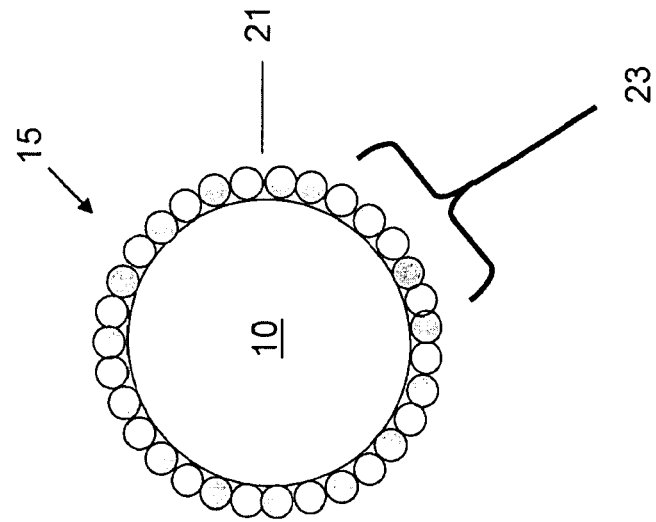
FIGS. 5A-5D illustrate quantum dots in various configurations.
Figure 5A:
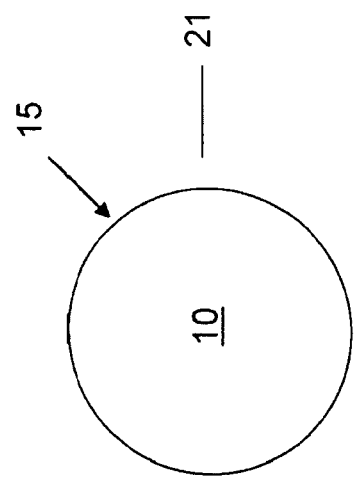

Referring to FIG. 5B, in an alternate embodiment, one or more metals 23 may be formed on outer surface 21 of semiconductor nanocrystal core 10 (referred to herein as "metal layer" 23) after formation of core 10 to form the quantum dot 15. In these embodiments, metal layer 23 is a layer of metal atoms non-bonded with each other and may act to passivate outer surface 21 of semiconductor nanocrystal core 10 and limit the diffusion rate of oxygen molecules to semiconductor nanocrystal core 10 effectively protecting the core from oxidation, as well as prevent lattice mismatch between the core and the shell. According to certain embodiments of the present invention, metal layer 23 is formed on outer surface 21 after synthesis of semiconductor nanocrystal core 10 (as opposed to being formed on outer surface 21 concurrently during synthesis of semiconductor nanocrystal core 10). When included, metal layer 23 is typically between 0.1 nm and 5 nm thick. Metal layer 23 may include any number, type, combination, and arrangement of metals. For example, metal layer 23 may be simply a monolayer of metals formed on outer surface 21 or multiple layers of metals formed on outer surface 21. Metal layer 23 may also include different types of metals arranged, for example, in alternating fashion. Further, metal layer 23 may encapsulate semiconductor nanocrystal core 10 as shown in FIG. 5B or may be formed on only parts of outer surface 21 of semiconductor nanocrystal core 10. Metal layer 23 may include the metal from which the semiconductor nanocrystal core is made either alone or in addition to another metal. Non-limiting examples of metals that may be used as part of metal layer 23 include Cd, Zn, Hg, Pb, Al, Ga, and In.

Semiconductor nanocrystal core 10 and metal layer 23 may be grown by the pyrolysis of organometallic precursors in a chelating ligand solution or by an exchange reaction using the prerequisite salts in a chelating ligand solution. The chelating ligands are typically lyophilic and have an affinity moiety for the metal layer and another moiety with an affinity toward the solvent, which is usually hydrophobic. Typical examples of chelating ligands include lyophilic surfactant molecules such as trioctylphosphine oxide (TOPO), trioctylphosphine (TOP), tributylphosphine (TBP), hexadecyl amine (HDA), dodecanethiol, and tetradecyl phosphonic acid (TDPA).

Figure 5D:
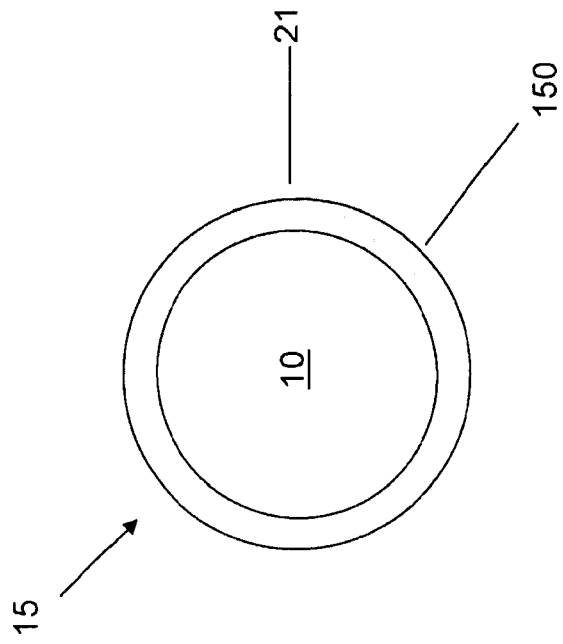
Figure 5C:
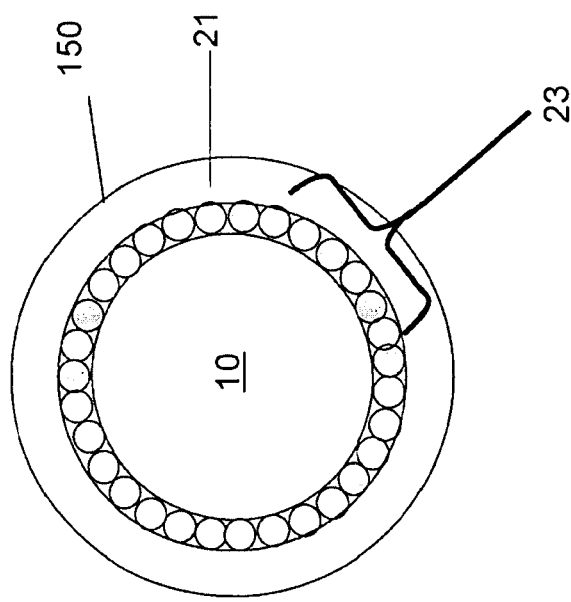

Referring to FIG. 5C, in an alternate embodiment, the present invention provides a quantum dot 15 further comprising a shell 150 overcoating metal layer 23. Shell 150 may comprise a semiconductor material having a bulk band gap greater than that of semiconductor nanocrystal core 10. In such an embodiment, metal layer 23 may act to passivate outer surface 21 of semiconductor nanocrystal core 10 as well as to prevent or decrease lattice mismatch between semiconductor nanocrystal core 10 and shell 150.

Shell 150 may be grown around metal layer 23, and can be between 0.1 nm and 10 nm thick. Shell 150 may provide for a type A semiconductor nanocrystal complex 15. Shell 150 may comprise one or more various different semiconductor materials such as CdSe, CdS, CdTe, ZnS, ZnSe, ZnTe, HgS, HgSe, HgTe, InP, InAs, InSb, InN, GaN, GaP, GaAs, GaSb, PbSe, PbS, PbTe, CuInGaS$_2$, CuInGaSe$_2$, AgInS$_2$, AgInSe$_2$, AuGaTe$_2$, and ZnCuInS$_2$.

One example of shell 150 that may be used to passivate outer surface 15 of semiconductor nanocrystal core 10 is ZnS. The presence of metal layer 23 may provide for a more complete and uniform shell 150 without the amount of defects that would be present with a greater lattice mismatch. Such a result may improve the quantum yield of resulting nanocrystal complex 15.

Semiconductor nanocrystal core 10, metal layer 23, and shell 150 may be grown by the pyrolysis of organometallic precursors in a chelating ligand solution or by an exchange reaction using the prerequisite salts in a chelating ligand solution. The chelating ligands are typically lyophilic and have an affinity moiety for the shell and another moiety with an affinity toward the solvent, which is usually hydrophobic. Typical examples of chelating ligands 160 include lyophilic surfactant molecules such as TOPO, TOP, TBP, HDA, dodecanethiol, and TDPA.

Referring to FIG. 5D, in an alternate embodiment, the present invention provides a quantum dot 15 comprising a semiconductor nanocrystal core 10 having an outer surface 21, as described above, and a shell 150, as described above, formed on the outer surface 21 of the core 10. The shell 150 may encapsulate semiconductor nanocrystal core 10 as shown in FIG. 5D or may be formed on only parts of outer surface 21 of semiconductor nanocrystal core 10.

EXAMPLES

Quantum Dot Particles Comprising Quantum Dot-Dielectric Particle Complexes

Materials Used:

| Fumed silica | |
|---|---|
| Gelest, Inc. | Particle size 20 nm; surface area 200 m$^2$/g; coated with hexamethyldisilazane (hydrophobic) |
| Cabot Corp. CAB-O-SIL TS-530, TS-720, M5 | Particle size 200 nm; surface area 115-225 m$^2$/g; hydrophobic, TS-720 hydrophobic, hydrophilic |
| WEST SYSTEM PHARMASEAL Type A Alumina | |
| nanoparticles (Aldrich) surface-treated (basic) surface-treated (neutral) Colloidal silica | |
| LUDOX LS (colloidal silica—30%) | Add 150 mL of water to 1.7 g of colloidal silica while stirring rapidly |

Example 1

Using Fumed Silica as the Dielectric Material

The quantum dots (100 mg in 5 mL toluene) were washed once with methanol and resuspended in 20 mL anhydrous toluene. To the suspension was added to 1 gram of fumed silica and the mixture was sonicated for 4 hours. The solvent was removed by evaporation. The resulting powder was optionally washed with methanol and optionally milled to size under 5 microns. The size was approximated using a microscope.

Example 2

Using Alumina as the Dielectric Material

The same procedure as in Example 1 was followed, except that alumina was used instead of fumed silica. It has been observed that less quantum dots were absorbed to alumina particles than to fumed silica particles by visual observation of the luminescence.

Example 3

Using Colloidal Silica as the Dielectric Material 150 mL of water was added to 1.7 g of colloidal silica (LUDOX LS, 30% silica in water by mass, from Grace Davison) while stirring rapidly. 50 mg of quantum dots were suspended in 10 mL of anhydrous toluene. The suspension was added to the colloidal silica solution. Colloidal silica (in solution). The mixture was left in a fume hood under stirring for 4 hours while allowing solvent to evaporate to a final volume of 45 ml. Precipitates formed from the mixture were separated out by centrifugation. 1.09 g of product was obtained and dried in air. The resultant product was a brittle fluorescent material which was ground into a fine powder using a mortar and pestle.

Quantum Dot Particles Comprising Quantum Dot-Crosslinked Silane Complex:

Example 4

Using 3-Amino Propyl Trimethoxysilane (APS)

Quantum dots (15 mg) were suspended in 1 mL of chloroform to form a 15 mg/mL solution. 1 mL of APS from Gelest, Inc. was added and sonicated for 2 hours. APS crosslinking was induced by adding 20 mL of water, heating to 70° C., and maintaining at the temperature under stirring for 12 hours. Precipitates formed in the reaction flask and were removed from the supernatant via centrifugation. The separated precipitates were dried and optionally milled afterward to achieve the particle size of less than 5 microns.

Example 5

Using 3-Mercapto Propyl Trimethoxysilane (MPS)

The same procedure as in Example 4 was followed, except that MPS was used instead of APS. The final product was another brittle material which was fluorescent. This was powdered with a mortar and pestle to achieve a fine, fluorescent powder.

Further Dielectric Coating

Example 6

Using Sodium Silicate (Water Glass) as the Coating Material

The quantum dots-absorbed silica particles from above examples were added to 50 mL of methanol or other polar or ionizable solvent while stirring, resulting in a suspension rather than a solution. Hydrophobic solvents should not be used because that would result in the removal of the quantum dots.

An appropriate amount of sodium silicate in aqueous solution (27% by weight, pH>11, made with silica from Aldrich) was prepared. DOWEX MARATHON MSC resin (slightly acidic, from Dow Chemical) was added to the solution to slightly reduce pH, using about 1 gram of resin. Alternatively, a weak acid such as mercaptoundecanoic acid (MUA) was added to the solution to bring the pH below about 9, with constant monitoring during a slow addition of MUA. Care was taken not to reduce the pH too much because it would result in silica precipitating out of solution. The solution was maintained at room temperature under stirring for 1 day. The precipitates formed were centrifuged out and dried. The resulting particles were re-suspended in an organic solvent, toluene, to test whether the quantum dots were in fact encapsulated with the silica. As the quantum dot particles did not resuspend in toluene, they were effectively coated in silica.

We claim:

1. A quantum dot particle on the micron or nanometer scale comprising:
a quantum dot-crosslinked silane complex, wherein a plurality of quantum dots are dispersed in a crosslinked silane matrix to form the complex, and wherein the complex is a particle on the micron or nanometer scale.

2. The quantum dot particle of claim 1, wherein the quantum dot particle has a diameter between about 20 nanometers and about 100 microns.

3. Powdered quantum dots comprising a plurality of the quantum dot particles of claim 1.

4. The quantum dot particle of claim 1, wherein the silane is 3-amino propyl trimethoxysilane or 3-mercapto propyl trimethoxysilane.

5. An optoelectronic device comprising a composite comprising a plurality of the quantum dot particles of claim 1 dispersed in a silicone material.

6. A photoluminescent device comprising a composite comprising a plurality of the quantum dot particles of claim 1 dispersed in a silicone material.

7. A method of making a plurality of the quantum dot particles of claim 1 comprising:
    (a) providing quantum dots, each quantum dot having surfactant attached to the outer surface;
    (b) displacing the surfactant on the outer surfaces of the quantum dots with a silane, wherein the silane is in a solution;
    (c) cross-linking the silane on the quantum dots and the silane in the solution to form a plurality of quantum dot-crosslinked silane complexes, each of the plurality of quantum dot-crosslinked silane complexes comprising a plurality of quantum dots dispersed in a crosslinked silane matrix; and
    (d) separating the plurality of quantum dot-crosslinked silane complexes from the solution.

8. The method of claim 7, wherein step (d) comprises subjecting the dispersion from step (c) to a solid-liquid separation process to isolate the quantum dot-crosslinked silane complexes.

9. The method of claim 7, further comprising breaking down the quantum dot-crosslinked silane complexes to particles on the nanometer or micron scale.

* * * * *